United States Patent
Rodal (10) Patent No.: US 8,005,447 B2
(45) Date of Patent: Aug. 23, 2011

(54) METHOD AND APPARATUS FOR PROVIDING A DUAL-LOOP PHASE LOCK LOOP

(75) Inventor: Eric Rodal, Gardnerville, NV (US)

(73) Assignee: Broadcom Corporation, Irvine, CA (US)

( * ) Notice: Subject to any disclaimer, the term of this patent is extended or adjusted under 35 U.S.C. 154(b) by 890 days.

(21) Appl. No.: 11/927,270

(22) Filed: Oct. 29, 2007

(65) Prior Publication Data

US 2009/0111408 A1 Apr. 30, 2009

(51) Int. Cl.
*H04B 1/18* (2006.01)
*H04B 7/00* (2006.01)
(52) U.S. Cl. ........ 455/180.3; 455/260; 455/264
(58) Field of Classification Search ........... 455/180.3, 455/180.1, 150.1, 130, 260, 264, 169.1, 255
See application file for complete search history.

(56) References Cited

U.S. PATENT DOCUMENTS

| 6,215,835 | B1* | 4/2001 | Kyles | 375/376 |
|---|---|---|---|---|
| 6,570,948 | B1* | 5/2003 | Marshall | 375/376 |
| 6,856,182 | B2* | 2/2005 | Moyal | 327/157 |
| 6,931,243 | B2* | 8/2005 | Goldman | 455/260 |
| 7,177,611 | B2* | 2/2007 | Goldman | 455/260 |
| 2007/0176694 | A1* | 8/2007 | Rhee et al. | 331/16 |
| 2008/0088379 | A1* | 4/2008 | Chen | 331/57 |
| 2008/0252383 | A1* | 10/2008 | Lee et al. | 331/10 |

* cited by examiner

*Primary Examiner* — Sonny Trinh
(74) *Attorney, Agent, or Firm* — McAndrews, Held & Malloy, Ltd.

(57) ABSTRACT

A method and apparatus for providing a dual-loop phase lock loop (PLL) for a radio-frequency (RF) receiver is provided. The dual-loop PLL may include coarse tuning circuitry and fine tuning circuitry. The coarse turning circuitry and fine tuning circuitry may be arranged in parallel. Both of the coarse tuning circuitry and fine tuning circuitry provide respective tuning signals to a voltage-controlled oscillator (e.g., a varactor tuned VCO). The coarse tuning circuitry and the fine tuning circuitry may provide the respective tuning signals simultaneously. In addition, coarse and fine tuning circuitry may be formed monolithically with other elements of the dual-loop PLL so as to provide a highly-integratable having a wide frequency lock range and high sensitivity.

18 Claims, 3 Drawing Sheets

METHOD AND APPARATUS FOR PROVIDING A DUAL-LOOP PHASE LOCK LOOP

BACKGROUND OF THE INVENTION

1. Field of the Invention

The present invention relates to radio frequency (RF) communications and, more particularly, to a method and apparatus for providing a dual-loop phase lock loop in a radio-frequency (RF) receiver.

2. Description of the Related Art

Increasing market penetration of wireless communications or simply, wireless devices, such as cellular telephones, radios, global navigation satellite systems (GNSS) receivers/transceivers, and the like, is generally premised on reducing costs associated with deployment of such devices while maintaining or improving performance and/or adding features thereto. One way to accomplish this task is to continually improve upon the devices' components that perform electronic functions for wireless communications. For example, through continuous improvement of such components, newer generations of such wireless devices are routinely deployed in smaller packages with more processing power and lower power consumption, yet cost less than their earlier counterparts.

One way to lower cost and improve performance is to use digital circuitry in substantially all of the subcomponents of a receiver. Digital circuits can be formed on a single substrate (i.e., monolithically) or a small number of substrates within an integrated circuit package that allow for improved power consumption as well as processing power. Such receivers are capable of receiving signals at very low signal strengths as well as providing digital signal processing in a single receiver integrated circuit.

Although most components within a digital receiver are digital in nature, certain components operate in the analog domain and are mounted "off chip". Such components include, for example, a low-noise amplifier, which functions to amplify RF signals; a mixer circuit, which functions to down-convert the RF signals; resistors and capacitors used by phase lock loop (PLL) circuits; and an automatic gain control (AGC) circuit, which functions to control a dynamic range of the receiver. To improve performance of the receiver, utilizing digital circuitry for as many components of a receiver as possible is desirable.

In particular, a conventional PLL circuit may use capacitor-based integrator and/or operational amplifiers that do not facilitate a single or multiple integrated circuit solution because capacitors and resistors used by the capacitor-based integrator and/or the operational amplifiers are located externally from the integrated circuit in which the PLL circuit is formed.

Furthermore, conventional PLLs utilize two-stage search and lock strategies that are time and power consuming. These two-stage search and lock strategies often require that the conventional PLLs undergo recalibration when tuning voltages run out of range. Such recalibration occurs the conventional PLLs are powered on for a prolonged time period, which may cause changes in temperature and/or other conditions that effect calibration. The re-calibration can be very problematic for RF receivers because the time and power spent on recalibration cannot be used for processing incoming signals.

Therefore, there is a need in the art for a method and apparatus for providing a fully integrated (i.e., no external components), dual-loop PLL within an RF receiver.

SUMMARY OF THE INVENTION

A method and apparatus for providing a dual-loop phase lock loop (PLL) for a radio-frequency (RF) receiver is provided. The dual-loop PLL includes coarse tuning circuitry and fine tuning circuitry. The coarse turning circuitry and fine tuning circuitry may be arranged in parallel. Both of the coarse tuning circuitry and fine tuning circuitry provide respective tuning signals to a voltage-controlled oscillator (VCO), such as a varactor-tuned VCO. The coarse tuning circuitry and the fine tuning circuitry may provide the respective tuning signals to the VCO simultaneously. In this manner, the dual-loop PLL may provide a highly-integratable solution having a wide frequency lock range and low phase noise.

BRIEF DESCRIPTION OF THE DRAWINGS

So the manner in which the above recited features are attained and can be understood in detail, a more detailed description is described below with reference to the Figures illustrated in the appended drawings.

It is to be noted the Figures in the appended drawings, like the detailed description, are examples. As such, the Figures and the detailed description are not to be considered limiting, and other equally effective examples are possible and likely. Furthermore, like reference numerals in the Figures indicate like elements, and wherein.

DETAILED DESCRIPTION

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

Described herein below are embodiments and other examples of a method and apparatus for providing a phase-lock loop (PLL) for a radio-frequency (RF) receiver, such as receiver adapted to process a satellite or cellular signal. These embodiments and other examples may be particularly useful for deployment in a receiver that is usable in a Global-Navigation-Satellite System (GNSS).

Those skilled in the art will appreciate that the method and apparatus may be used with various other types of mobile or wireless systems and devices. In addition, these wireless devices may be "location-enabled," and may be embodied as cellular telephones, pagers, laptop computers, personal digital assistants (PDAs), and like type wireless devices known in the art. Generally, location enabling the mobile devices may be facilitated by including within the devices a capability of processing satellite signals of the GNSS ("GNSS satellite signals").

In addition, the details of the method and apparatus provided herein allow one skilled in the art to recognize that, as compared to conventional methods and apparatuses, one or more embodiments and other examples of the apparatus and/or devices that implement the method provide an improved PLL having (i) the ability to lock at a desired frequency (selected form a wide range of frequencies), (ii) high sensitivity to the desired frequency, and (iii) minimized phase noise.

Example Global-Navigation-Satellite-System Receiver

Figure 1:
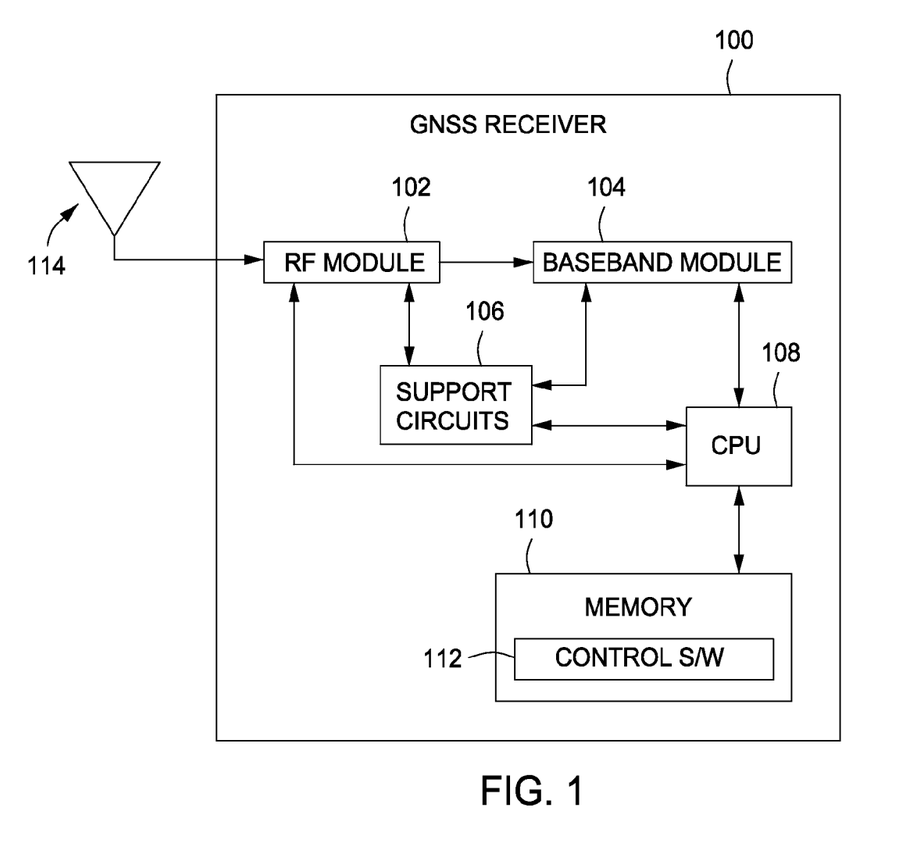
FIG. 1 is a block diagram illustrating an example of a global-navigation-satellite-system (GNSS) receiver.

FIG. 1 is a block diagram illustrating of an example of a GNSS receiver 100. The GNSS receiver 100 may include a RF module 102, a baseband module 104, support circuits 106, a central processing unit (CPU) 108, and memory 110.

The RF module 102 includes a number of elements that function to process one or more RF signals to produce a respective number of baseband signals. To facilitate such processing, the RF module includes an input and an output. The input is communicatively coupled to and adapted to receive the RF signals from an RF antenna 114, which may be tuned to receive the RF signals from, for example, one or more GNSS satellites. The output is communicatively coupled to an input of the baseband module 104, and is adapted to provide the baseband signals to the baseband module 104. An example of the RF module 102 is described below with respect to FIG. 2.

The baseband module 104 functions to process the baseband signals so as to extract information ("satellite-navigation information") that may be used by the CPU 108 to compute one or more positions of the GNSS receiver 100 ("receiver positions"). To facilitate this, the baseband module includes an output that is operable to supply the satellite-navigation information to an input of the CPU 108.

The CPU 108, in turn, functions to compute the receiver positions as a function of the satellite-navigation data obtained at its input. In addition, the CPU 108 may function as a host-based controller. As a host-based controller, the CPU 108 is operable to control and/or assist in the control of the RF module 102 and the baseband module 104 to cause such modules to carry out their functions. To facilitate the functions of the CPU 108, the CPU 108 is operable to obtain from the memory 110 and execute computational and/or control software 112 stored therein.

The support circuits 106 may include well known circuits that facilitate operation of the CPU 108, the RF module 102 and/or the baseband module 104. These support circuits 106 may include any of, any multiple of, any combination of or any combination of multiples of an oscillator, a power supply, clock circuit, cache and the like.

The GNSS receiver 100 may be implemented as a standalone receiver or as a component within a system or device. Some or all of the GNSS receiver 100, for example, may be integrated into, integral or otherwise combined with circuitry of a mobile device (e.g., a cellular telephone and the like) and/or an ad hoc (e.g., BLUETOOTH, IEEE 802.11 et seq., and the like) network node. In such embodiment, the CPU 108, memory 110 and some of the support circuits 106 may form a portion of the cellular telephone.

As another alternative, the GNSS receiver 100 may be configured to communicate with a wireless communication system and/or other type of network (not shown). To facilitate this, the GNSS receiver 100 may include a transmitter (not shown), and as such, be configured as a transceiver. As a transceiver, the GNSS receiver 100 may request and obtain from an external source assistance information to assist in acquiring and processing the RF and baseband signals and/or computing the receiver positions.

Examples of the GNSS receiver 100 are provided in commonly-assigned U.S. Pat. Nos. 6,411,892; 6,429,814; 6,453,237, 6,560,534, 6,542,820, 6,587,789; 6,590,530; 6,703,972; 6,704,651; and 6,813,560; U.S. patent application Ser. No. 09/993,335, filed Nov. 6, 2001; Ser. No. 10/349,493, filed Jan. 22, 2003; Ser. No. 10/359,468, filed on Feb. 5, 2003; Ser. No. 10/692,292, filed Oct. 23, 2003; Ser. No. 10/719,890, filed Nov. 21, 2003; Ser. No. 10/926,792, filed Aug. 26, 2004; Ser. No. 10/884,424, filed on Jul. 1, 2004; Ser. No. 10/912,516, filed Aug. 5, 2004; Ser. No. 10/932,557, filed on Sep. 1, 2004; Ser. No. 10/968,345, filed on Oct. 19, 2004; Ser. No. 11/077,380, filed on Mar. 3, 2005; Ser. No. 11/206,615, filed on Aug. 18, 2005; Ser. No. 11/261,413, filed on Oct. 28, 2005; Ser. No. 11/333,787, filed Jan. 17, 2006; Ser. No. 11/567,629, filed Dec. 6, 2006; and U.S. Provisional Patent Application Ser. No. 60/760,140, filed on Jan. 19, 2006; all of which are incorporated herein by reference in their entirety. The GNSS receiver 100 may be configured in other ways as well.

Example RF Module

Figure 2:
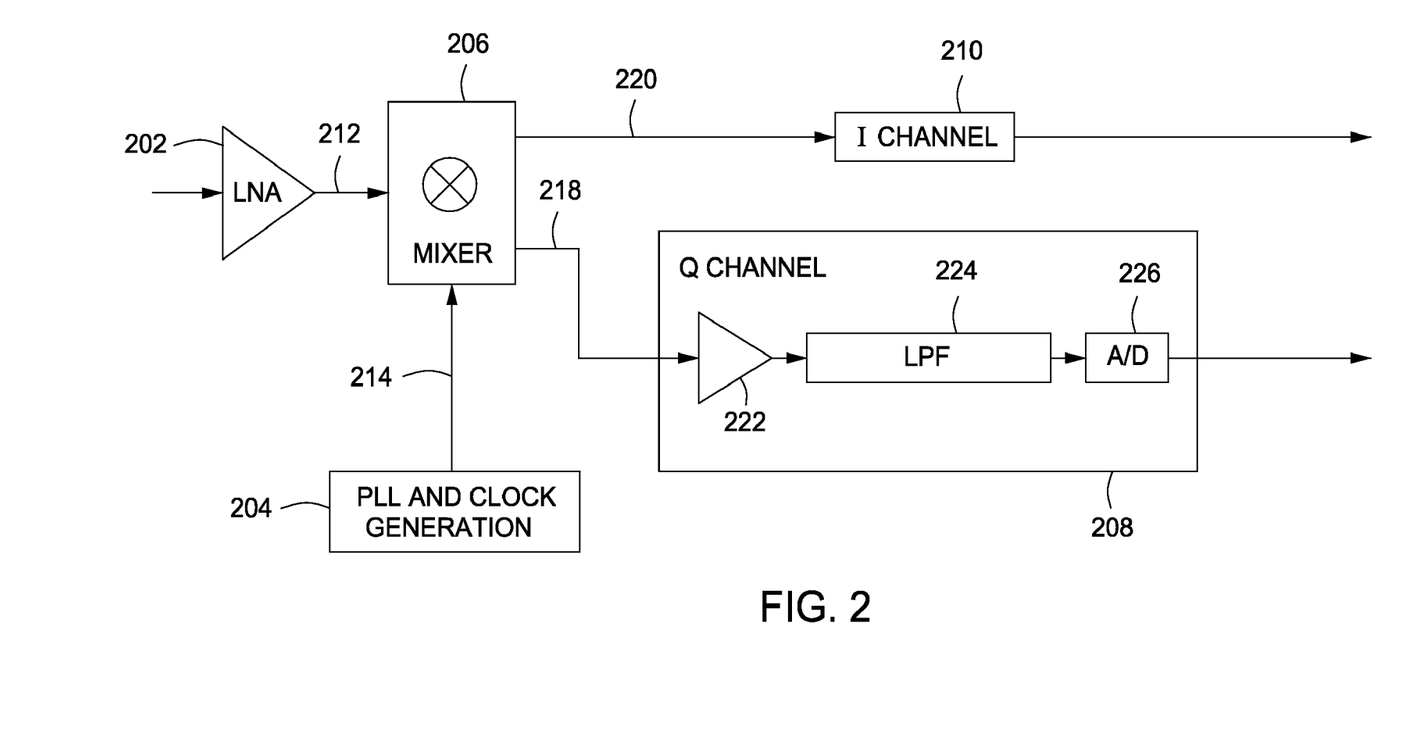
FIG. 2 is a block diagram illustrating an example of a radio frequency (RF) module of a GNSS receiver.

FIG. 2 is a block diagram illustrating an example of the RF module 200. For convenience, the RF module 200 is described with reference to the GNSS receiver 100 of FIG. 1. The RF module 200, however, may be implemented or used in any RF receiver, transceiver and/or other like-type architecture.

The RF module 102 includes a low-noise amplifier (LNA) 202, a phase-lock loop (PLL) and clock generator 204, a mixer 206 and first and second processing channels 208, 210. The mixer 206 functions to frequency mix a RF signal with a control signal, such as an oscillator signal, to obtain and output two signals ("first and second mixed signals") having phases in synchronism with respective phases of the RF signal (e.g., in-phase and quadrature components of the RF signal).

To facilitate this, the mixer includes first and second inputs, and first and second outputs. The first and second inputs are communicatively coupled to respective outputs of the LNA 202 and PLL and clock generator 204, and are adapted to receive the RF and control signals that are output from such outputs. The first and second outputs are communicatively coupled to and adapted to provide the first and second mixed signals to the first and second processing channels 208, 210, respectively.

Although the mixer 206, as shown and described, includes only two outputs and provides only two mixed signals, the mixer 206 may include more or fewer outputs and may provide more or fewer mixed signals. Details of an example of the mixer 206 are disclosed in U.S. patent application Ser. No. 11/927,253, filed Oct. 29, 2007, which is incorporated by reference herein in its entirety.

The LNA 202 functions to amplify, filter and output to the mixer 206 the RF signal. To facilitate this, the LNA 202 includes an input that is adapted to receive the RF signal from the antenna 114 (FIG. 1). Typically, the LNA 202 amplifies and filters the RF signal so as to minimize noise generated during amplification of the RF signal. The output of the LNA 202, which, as noted, is communicatively coupled to the first input of the mixer 206, is adapted to provide the RF signal, as amplified and filtered, to the mixer 206.

The PLL and clock generator 204 includes circuitry that functions to generate and provide the control signal to the mixer 206. This control signal may be, for example, a local oscillator signal. Details of an example of the PLL and clock generator 204 are described in more detail below.

Each of the first and second processing channels 208, 210 is configured to respectively process the first and second mixed signals into respective first and second baseband signals. The first processing channel 208 includes an amplifier 222, a low-pass filter 224 and an analog-to-digital (A/D) converter 226. The second processing channel 210 likewise includes an amplifier, a low-pass filter, and an A/D converter; all of which are not shown for simplicity of exposition. In addition, only the first processing channel 208 is described herein for brevity sake.

The amplifier 222 is adapted to amplify the first mixed signal and provide it to the low-pass filter 224. To facilitate this, the amplifier 222 includes an input that is communicatively coupled to and adapted to receive the first output signal from the first output of the mixer 206. In addition, the amplifier 222 includes an output that is communicatively coupled to and adapted to provide the first mixed signal, as amplified, to an input of the low-pass filter 224.

The low-pass filter (LPF) 224 functions to filter the first mixed signal before providing it to the A/D converter 226. Typically, the filter 224 provides signal-band limiting and removal of out-of-band interference. To facilitate filtering, the LPF 224 includes, in addition to its input coupled to the output of the amplifier 222, an output that is communicatively coupled to and adapted to provide the first mixed signal, as filtered, to an input of the A/D converter 226. The LPF 224 may be, for example, an analog low-pass filter and may have a bandwidth of approximately 10 MHz. The LPF 224, however, may have other bandwidths as well.

The A/D converter 226 is adapted to (i) convert the first mixed signal (as amplified and filtered) into a digital waveform, which is representative of the first mixed signal ("first digital signal"); and (ii) provide the first digital signal to the baseband module 104. To facilitate this, the A/D converter 226 includes, in addition the input coupled to the LPF 224, an output that is communicatively coupled to and adapted to provide the first digital signal to the baseband module 104.

The A/D converter 226 may be adapted to have a range in accuracy from one bit to three or more bits. More bits increases a signal-to-noise ratio (SNR) of the first mixed signal, and thus performance of the GNSS receiver 100.

As noted above, the second processing channel 210 includes elements similar or the same as the first processing channel 208. In addition, the second processing channel 210 is adapted to provide, in much the same manner as the first processing channel 208, a second digital signal to the baseband module 104 (FIG. 1). Although the RF module 200, as shown, includes only two processing channels, the RF module 200 may include more or fewer processing channels.

Example PLL and Clock Generator Architecture

Figure 3:
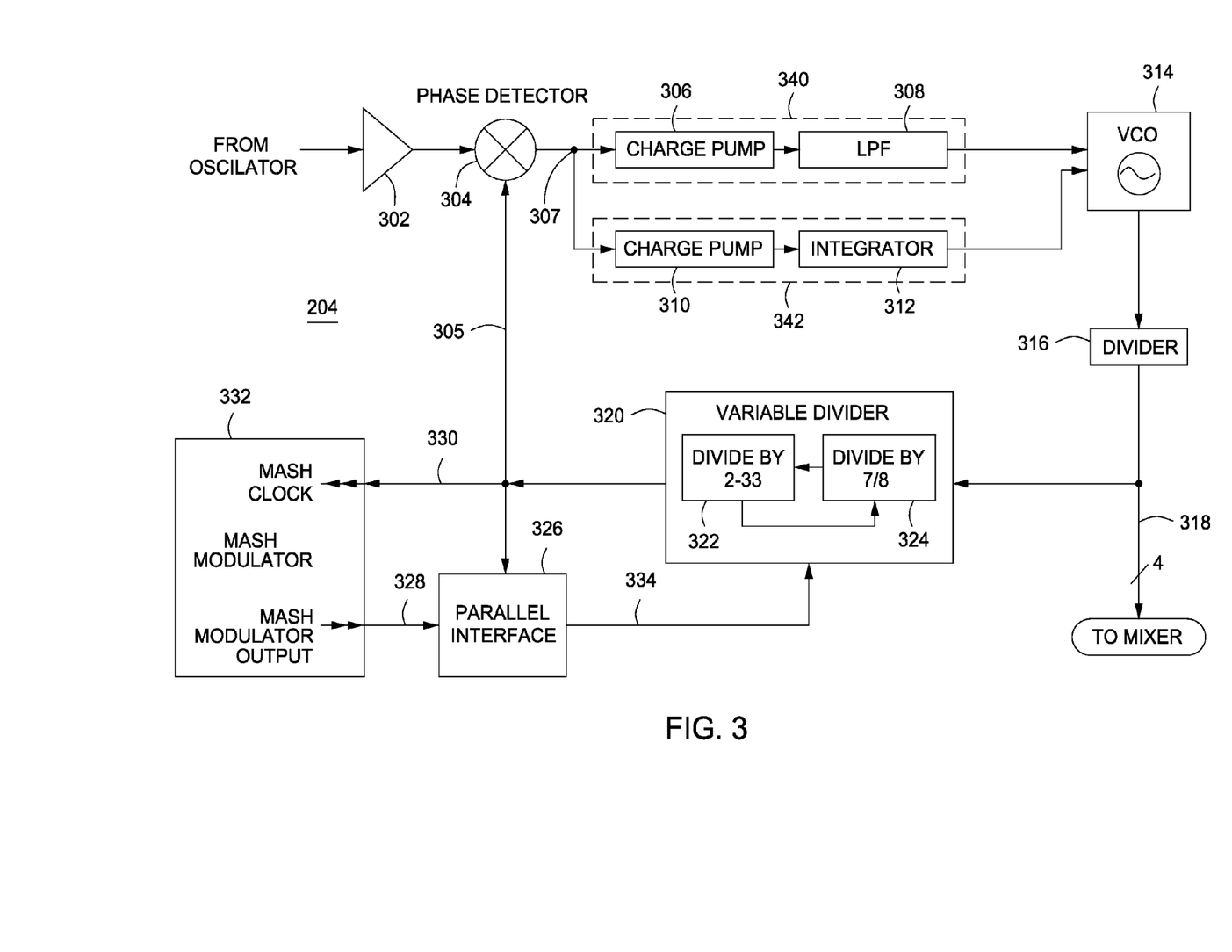
FIG. 3 is a block diagram illustrating an example of a phase-lock-loop (PLL) circuit.

FIG. 3 is a block diagram illustrating an example of a phase-locked loop (PLL) and clock generator 204. The PLL and clock generator of FIG. 3 is described herein below with reference to the PLL and clock generator 204 of FIG. 2 for simplicity of exposition. The PLL and clock generator of FIG. 3, however, may be implemented or otherwise used with other architectures.

The PLL and clock generator 204 includes a number of elements that are adapted to receive a reference signal from an oscillator (e.g., a temperature-controlled-crystal oscillator), and provide the reference signal to the mixer 206. These elements include, for example, an amplifier 302, a phase detector 304, a low-pass filer (LPF) loop 340, an integration loop 342, a voltage-control oscillator (VCO) 314, a divider 316, a variable divider 320, an parallel interface 326, and a multi-stage-noise-shaping (MASH) modulator 330. Each of these elements includes at least one input and at least one output. Given the LPF and integration loops 340, 342, the PLL and clock generator 204 is hereinafter referred to as a dual-loop PLL and clock generator 204.

The amplifier 302 is adapted to buffer the reference signal received from the oscillator, and provide such buffered reference signal to the phase detector 304. The reference signal may, for example, have a frequency that is between 10 and 40 MHz. The frequency of the reference signal may be other values as well. To facilitate its functions, the amplifier 302 includes an input that is adapted to receive the reference signal from the oscillator, and an output that is communicatively coupled to and adapted to provide the buffered reference signal to a first input of the phase detector 304.

The phase detector 304 functions to mix or otherwise combine the reference signal and a signal that represents the control signal that is provided to the mixer 206 (FIG. 1) to form a mixed signal. This mixed signal has a pulse width or average DC value that is proportional to a difference between phases of the reference signal and the signal that represents the control signal that is provided to the mixer 206 (hereinafter the "representative-control signal").

To facilitate the mixing, the phase detector 304 includes, in addition to the input communicatively coupled to the amplifier 302, a second input and an output. The second input is communicatively coupled to and adapted to receive the representative-control signal via path 305. The output is communicatively coupled to node 307 and adapted to provide the mixed signal to both of the LPF and integration loops 340, 342.

The LPF and integration loops 340, 342 function to (i) convert the mixed signal into first and second tuning signals, respectively, and (ii) provide the first and second tuning signals to first and second tuning circuitry of the VCO 314, respectively. The first and second tuning circuitry may be arranged in parallel, and each of the first and second tuning circuitry may include one or more varactors. The varactors, in turn, may be arranged so as to have a single-ended input, a differential input or a multiple-ended input.

In addition, the varactors of the first tuning circuitry may have a smaller capacitance than the varactors of the second tuning circuitry. This way, the varactors of the first tuning circuitry may be communicatively coupled to and adapted to provide the first tuning signal to a low-sensitivity tuning port of the VCO 314, and the varactors of the second tuning circuitry may be communicatively coupled to and adapted to provide the second tuning signal to a high-sensitivity port of the VCO 314.

To facilitate providing the first tuning signal, the LPF loop 340 may include a first charge pump 306 and a LPF 308. The first charge pump 306 may be formed monolithically with the other elements of the dual-loop PLL and clock generator 204. Alternatively, the first charge pump 306 may be formed on a semiconductor substrate with none or some of the other elements of the dual-loop PLL and clock generator 204, and interconnected to the elements of the dual-loop PLL and clock generator 204 not included on such substrate. If not formed monolithically, the first charge pump 306 may be packaged along with the other elements of the dual-loop PLL and clock generator 204.

The first charge pump 306 functions to convert the mixed signal to a first pumped signal. To facilitate this, the first charge pump 306 includes an input that is communicatively coupled to and adapted to obtain the mixed signal from the node 307. The first charge pump 306 also includes an output that is communicatively coupled to and adapted to provide a first pumped signal to an input of the LPF 308.

The LPF 308 may be formed as a parallel combination of a resistor (R) and a capacitor (C) or other form of an RC filter, and may be formed monolithically with the other elements of the dual-loop PLL and clock generator 204. Alternatively, the LPF 308 may be formed on a semiconductor substrate with none or some of the other elements of the dual-loop PLL and clock generator 204 and interconnected to the elements of the dual-loop PLL and clock generator 204 not included on such substrate. If not formed monolithically, the LPF 308 may be packaged along with the other elements of the dual-loop PLL and clock generator 204.

The LPF 308 functions to filter the first pumped signal and provide the first tuning signal to the VCO 314. To facilitate this, the LPF 308 includes, in addition to the input communicatively coupled to the output of the first charge pump 306, an output that is communicatively coupled to and adapted to provide the first tuning signal to the first tuning circuitry of the VCO 314.

To facilitate providing the second tuning signal, the integration loop 342 may include a second charge pump 310 and an integrator 312. The second charge pump 310 may be formed monolithically with the other elements of the dual-loop PLL and clock generator 204. Alternatively, the second charge pump 310 may be formed on a semiconductor substrate with none or some of the other elements of the dual-loop PLL and clock generator 204, and interconnected to the elements of the dual-loop PLL and clock generator 204 not included on such substrate. If not formed monolithically, the second charge pump 310 may be packaged along with the other elements of the dual-loop PLL and clock generator 204.

The second charge pump 310 functions to convert the mixed signal to a second pumped signal. To facilitate this, the second charge pump 310 includes an input that is communicatively coupled to and adapted to obtain the mixed signal from the node 307. The second charge pump 310 also includes an output that is communicatively coupled to and adapted to provide a second pumped signal to an input of the integrator 312.

The integrator 312 may be formed monolithically with the other elements of the dual-loop PLL and clock generator 204. Alternatively, the integrator 312 may be formed on a semiconductor substrate with none or some of the other elements of the dual-loop PLL and clock generator 204 and interconnected to the elements of the dual-loop PLL and clock generator 204 not included on such substrate. If not formed monolithically, the integrator 312 may be packaged along with the other elements of the dual-loop PLL and clock generator 204.

The integrator 312 functions to integrate the second pumped signal and provide the second tuning signal to the VCO 314. To facilitate this, the integrator 312 includes, in addition to the input that is communicatively coupled to the output of the second charge pump 310, an output that is communicatively coupled to and adapted to provide the second tuning signal to the second tuning circuitry of the VCO 314.

The VCO 314, in addition to the first and second tuning circuitry, includes an output that is communicatively coupled to and adapted to provide a tuned signal having the desired frequency to an input of the divider 316. The divider 316 functions to multiply the desired frequency of the tuned signal using a divide-by ratio so as to form the control signal that has a frequency ("control-signal frequency") equal to the desired frequency multiplied by the divide-by ratio. The divide-by ratio may be one-half or some other fraction or number.

To facilitate carrying out its function, the divider 316 includes an output, in addition to the input communicatively coupled to the output of the VCO 412. This output is communicatively coupled to and adapted to provide the control signal to (i) the mixer 206 (FIG. 2) and (ii) an input of the variable divider 320.

The variable divider 320 functions to divide the control-signal frequency of the control signal on a varying basis to form the representative-control signal. To facilitate this, the variable divider 320 may include, in addition to the aforementioned input, an output that is communicatively coupled to and adapted to provide the representative-control signal to (i) a mash-clock input of the mash modulator 322 via path 330, (ii) a first input to the parallel interface, and (iii) the second input of phase detector 304 via path 305 (as noted above).

The variable divider 320 may form the representative-control signal by multiplying the control-signal frequency of the control signal by a divide-by ratio that is changed on a pseudo-random basis. The variable divider 320 may change the divide-by ratio in accordance with, for example, a pseudorandom signal that is formed in accordance with a mash-modulator signal formed by the mash modulator 332. By being driven in accordance with the mash-modulator signal, the variable divider 320 may form the representative-control signal having a smaller number of "spurs" in frequency than if driven by another type of signal.

To facilitate forming the representative-control signal, the variable divider 320 may include, for example, first and second divider modules 322, 324. The first and second divider modules 322, 324 may be adapted to respectively multiply the control-signal frequency of the control signal by first and second divide-by ratios in accordance with the mash signal. The first divide-by ratio may be selected, for example, from a range of 1:2 to 1:33; and the second divide-by ratio may be selected, for example, from a range of 1:7 to 1:8. The first and second divider modules 322, 324 may be configured to change the first and second divide-by ratios (i) responsive to a condition, such as upon receiving the mash signal with different characteristics, (ii) responsive to a trigger, such as upon detection of a portion of timing or clock signal (e.g., a leading or trailing edge of the timing or clock signal); (iii) periodically; and/or (iv) in continuous fashion, such as every cycle of the timing or clock signal.

The mash modulator 332 functions to (i) form the mash-modulator signal as a function of the representative-control signal received at its mash-clock input, and (ii) provide the mash-modulator signal to the parallel interface 326. The mash-modulator signal may be, for example, a pseudo-randomly modulated signal. The mash modulator 332 includes a mash-modulator output that is communicatively coupled to and adapted to provide the mash-modulator signal to a second input of the parallel interface 326 via the path 328.

The parallel interface 326 functions to convert the mash-modulator signal received on its second input into the pseudorandom signal used to control the variable divider 320 using the representative-control signal as a clocking signal. The parallel interface 326 may form the pseudorandom signal so that it pseudorandomly varies in accordance with the mash-modulator signal. The pseudorandom signal may be, for example, an 8-bit wide, parallel signal.

Example PLL and Clock Generator Operation

In operation, the phase detector 304 obtains and mixes the reference signal, which has a given frequency (e.g., 10-40 MHz), and the representative-control signal to form the mixed signal, which, as noted, has a duty cycle or average DC value that is the difference between phases of the reference signal and the representative-control signal. After forming the mixed signal, the phase detector 304 supplies the mixed signal to the node 307.

The LPF and integrator loops 340, 342 obtain the mixed signal via node 307. Using the mixed signal, the LPF loop 340 forms the second tuning signal, which may be, for example, in the form of a fine tuning voltage (e.g., 23 MHz/V), and the integrator loop 342 forms the first tuning signal, which may be, for example, in the form of a coarse tuning voltage (e.g., 800 MHz/V).

The first and second tuning signals are respectively applied to the first and second tuning circuitry of VCO 314 to rapidly tune and maintain the VCO 314 at a desired frequency. Typically, the first and second tuning signals are applied simultaneously to the first and second tuning circuitry of VCO 314. The second tuning signal causes the VCO 314 to tune its frequency at or near the desired frequency (i.e., coarsely tune), and the first tuning signal causes the VCO 314 to fine tune its frequency about the desired frequency (i.e., finely tune).

Beneficially, the first and second tuning signals (and, in turn, the LPF and integrator loops 340, 342) provide the dual-loop PLL and clock generator 204 with an ability to lock at the desired frequency, while also providing low phase noise to the desired frequency. This is because the first tuning signal may be applied to the low-sensitivity port of the VCO 314 so as to finely tune the VCO 314, and (ii) the second tuning may be applied to the high-sensitivity port of the VCO 314 so as to coarsely tune the VCO 314 from a wide range of frequencies.

Also, by providing both the first and second tuning signals, the LPF and integrator loops 340, 342 obviate the need for pre-tuning of the VCO 314. By obviating pre-tuning, the LPF and integrator loops 340, 342 reduce complexity of the dual-loop PLL and clock generator 204 and enhance robustness as compared to conventional PLLs. Such reduced complexity and enhanced robustness may be realized because the coarse and fine tuning provided by the first and second tuning signals substantially reduce and/or eliminate a possibility that, unlike a conventional PLL loop, the dual-loop PLL and clock generator 204 will not run not out of range. As such, extra measures to eliminate running out of range are not needed.

In addition, the LPF and integrator loops 340, 342 enable the dual-loop PLL and clock generator 204 to provide a stable PLL loop that has the ability to lock at the given frequency without adding significant phase noise. For example, noise in the integrator loop 342 can be diminished to almost zero because the integrator loop 342 may be formed without resistors in its circuit topology. The integrator 312 may be formed, for example, as a capacitor, which may have a small capacitance value (and in turn, small physical size) because the second tuning signal enables coarse tuning of the VCO 314, and because the second pumped signal provided by the second charge pump 310 may be formed so as to exhibit a small amount of current. By connecting the output of the second charge pump 310 to the capacitor, the integrator loop 342 is essentially an ideal integrator, and accordingly generates a very low amount of noise.

Any noise in the LPF loop 340, like the integrator loop 342, may also be diminished to almost zero. This is because the LPF loop 340 is coupled to the low-sensitivity port of the VCO 314. Thus, any noise from the resistor R in the LPF 308 has only a small effect on overall phase noise of PLL loop.

After lock, the output of VCO 314 provides the tuned signal to the input of the divider 316. The divider 316, in turn, applies its divide-by ratio (e.g., one-half) to the tuned signal to form the control signal, which has a given frequency (e.g., 1574 MHz). The divider 316 also outputs the control signal to (i) the mixer 206 via path 318 and (ii) the first input of the variable divider 320.

The variable divider 320, in turn, forms the representative-control signal as a function of the control signal received on its first input and the pseudorandom signal received on its second input. As noted above, the pseudorandom signal is formed in accordance with a mash-modulator signal formed by the mash modulator 332, and is formed so as to cause the variable divider 320 to pseudorandomly divide the control signal. After forming the representative-control signal, the variable divider 320 supplies the representative-control signal to (i) the second input of the phase detector 304, which uses it to form the mixed signal; (ii) the mash-clock input of the mash modulator 332, which uses it as a timing or clock signal, and (ii) the first input of the parallel interface 326, which also uses it as a timing or clock signal.

The mash modulator 332, in turn, forms the mash-modulator signal as a function of the representative-control signal received on the mash-clock input via the path 328. After forming the mash modulator signal, the mash modulator 322 provides the mash-modulator signal to the second input of the parallel interface 326.

The parallel interface 326, in turn, forms the pseudorandom signal as a function of the mash-modulator signal and the representative-control signal received on the respective inputs. In addition, the parallel interface 326 supplies, via its output, the pseudorandom signal to the second input of the variable divider 320.

Although the dual-loop PLL and clock generator 204, as shown and described, includes both the LPF and integrator loops 340, 342, the dual-loop PLL and clock generator 204 may be formed (i) without one of the LPF and integrator loops 340, 342 or (ii) so that the LPF loop 340 or the integrator loop 342 may be switchably disconnected. Without the LPF loop 342, however, the dual-loop PLL and clock generator 204 might not be able to form the stable PLL loop. Without the integrator loop 342, the dual-loop PLL and clock generator 204 may be able to form the stable PLL, but the dual-loop PLL and clock generator 204 may suffer performance degradation due to low loop gain at low frequencies. Also, the PLL tuning range would be quite small because of low VCO gain provided by the LPF loop 340.

In addition, all of the elements of the dual-loop PLL and clock generator 204 may be formed monolithically. Alternatively, all of the elements of the dual-loop PLL and clock generator 204 may be formed on a plurality of semiconductor substrates, and may be appropriately interconnected. When not formed monolithically, the plurality of semiconductor substrates (and the elements thereon) may be packaged together.

As another alternative, some or all of the amplifier 302, phase detector 304, LPF loop 340, integration loop 342, VCO 314, divider 316, variable divider 320, parallel interface 326, and MASH modulator 330 may be formed monolithically or on a plurality of semiconductor substrates and appropriately interconnected. As above, some or all of the amplifier 302, phase detector 304, LPF loop 340, integration loop 342, VCO 314, divider 316, variable divider 320, parallel interface 326, and MASH modulator 330 formed on the plurality of semiconductor substrates may be packaged together, when not formed monolithically.

Variations of the method, apparatus and system described above are possible without departing from the scope of the invention. In view of the wide variety of embodiments that can be applied, it should be understood that the illustrated embodiments are exemplary only, and should not be taken as limiting the scope of the following claims. For instance, in the exemplary embodiments described herein include handheld devices, which may include or be utilized with any appropriate voltage source, such as a battery and the like, providing any appropriate voltage.

In addition, any of the communication networks referenced may be a partial or full deployment of most any communication or computer network, and thus, can include a few or many network elements, most of which are not shown. Each of the communication networks may include circuit-switched as well as packet-data elements to provide transport of the multimedia content and/or adapted-multimedia content, and can be public or private, terrestrial wireless or satellite, and/or wireline.

Each of the networks may include portions of a Public Switch Telephone Network (PSTN), the Internet, core and proprietary public networks, wireless voice and packet-data networks, such as 1 G, 2 G, 2.5 G and 3 G telecommunication networks, wireless office telephone systems ("WOTS") and/or wireless local area networks (WLANs), including, Bluetooth and/or IEEE 802.11 WLANs, and the like.

Moreover, in the embodiments described above, processing platforms, computing systems, controllers, and other devices containing processors are noted. These devices may contain at least one Central Processing Unit ("CPU") and memory. In accordance with the practices of persons skilled in the art of computer programming, reference to acts and symbolic representations of operations or instructions may be performed by the various CPUs and memories. Such acts and operations or instructions may be referred to as being "executed," "computer executed" or "CPU executed."

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigure or otherwise alter the CPU's operation, as well as other processing of signals. The memory locations where data bits are maintained are physical locations that have particular electrical, magnetic, optical, or organic properties corresponding to or representative of the data bits. It should be understood that the exemplary embodiments are not limited to the above-mentioned platforms or CPUs and that other platforms and CPUs may support the described methods.

The data bits may also be maintained on a computer readable medium including magnetic disks, optical disks, and any other volatile (e.g., Random Access Memory ("RAM")) or non-volatile (e.g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system. It should be understood that the exemplary embodiments are not limited to the above-mentioned memories and that other platforms and memories may support the described methods.

Exemplary embodiments have been illustrated and described. Further, the claims should not be read as limited to the described order or elements unless stated to that effect. In addition, use of the term "means" in any claim is intended to invoke 35 U.S.C. §112, ¶6, and any claim without the word "means" is not so intended.

What is claimed is:

1. An apparatus for tuning a voltage-controlled oscillator within a receiver, the apparatus comprising:
   first tuning circuitry operable to finely tune the voltage controlled oscillator as a function of a given signal input to the first tuning circuitry;
   second tuning circuitry operable to coarsely tune the voltage controlled oscillator as a function of the given signal input, wherein the given signal input is input to the second tuning circuitry, wherein the first and second circuitries are operable to, respectively, finely and coarsely tune the voltage-controlled oscillator simultaneously; and
   a common circuit, wherein the common circuit comprises:
      a variable divider for dividing a signal output from the voltage-controlled oscillator;
      a mash modulator, coupled to the variable divider, for pseudo-randomly altering a divide-by ratio of the variable divider; and
      a phase detector, coupled to the variable divider and the first and second tuning circuits, for comparing a phase of a reference signal to a phase of the signal output from the voltage-controlled oscillator.

2. The apparatus of claim 1, wherein the second tuning circuitry is coupled in parallel with the first tuning circuitry.

3. The apparatus of claim 1, wherein the first tuning circuitry or the second tuning circuitry is formed monolithically with the voltage-controlled oscillator.

4. The apparatus of claim 1, wherein the first and second tuning circuitries are formed monolithically with the voltage-controlled oscillator.

5. The apparatus of claim 1, wherein the mash modulator is adapted to use the signal output from the voltage-controlled oscillator as a clock signal.

6. The apparatus of claim 1, wherein the common circuit is formed monolithically with the voltage-controlled oscillator and the first or second tuning circuitries.

7. The apparatus of claim 1, wherein the common circuit is formed monolithically with the first tuning circuitry, the second tuning circuitry and the voltage-controlled oscillator.

8. The apparatus of claim 1, wherein the first tuning circuitry comprises a charge pump coupled to a low pass filter.

9. The apparatus of claim 1, wherein the second tuning circuitry comprises a charge pump coupled to an integrator.

10. The apparatus of claim 1, wherein the voltage-controlled oscillator comprises first and second varactors, wherein the first varactor is coupled to the first tuning circuitry, and wherein the second varactor is coupled to the second tuning circuitry.

11. The apparatus of claim 10, wherein the first varactor is coupled to a low-sensitivity port of the voltage controlled oscillator, and wherein the second varactor is coupled to a high-sensitivity port of the voltage-controlled oscillator.

12. A method of forming a phase locked loop, the method comprising:
   dividing a first signal output from a voltage-controlled oscillator;
   comparing a phase of a reference signal to a phase of a second signal to produce a phase-difference signal, wherein the second signal is representative of the first signal;
   applying the phase-difference signal to first tuning circuitry and second tuning circuitry, wherein the first tuning circuitry produces a fine tuning voltage and the second tuning circuitry produces a coarse tuning voltage; and
   simultaneously applying both the fine and coarse tuning voltages to the voltage controlled oscillator.

13. The method of claim 12, wherein dividing a first signal output from a voltage-controlled oscillator comprises: applying a different divide-by ratio to the signal upon each clock cycle.

14. The method of claim 13, further comprising: selecting the divide-by ratio on a pseudo-random basis.

15. The method of claim 12, wherein the coarse tuning voltage is generated by integrating the phase-difference signal.

16. The method of claim 12, wherein the fine tuning voltage is generated by low pass filtering the phase-difference signal.

17. An integrated circuit for providing a phase-lock loop within a receiver, the integrated circuit comprising:
  a voltage-controlled oscillator;
  first tuning circuitry operable to finely tune the voltage controlled oscillator as a function of a given signal input to the first tuning circuitry;
  second tuning circuitry operable to coarsely tune the voltage controlled oscillator as a function of the given signal input, wherein the given signal input is input to the second tuning circuitry, wherein the first and second circuitries are operable to, respectively, coarsely and finely tune the voltage-controlled oscillator simultaneously, and wherein the voltage-controlled oscillator, the first tuning circuitry and the second tuning circuitry are formed on at least one semiconductor substrate; and
  a common circuit, wherein the common circuit comprises:
    a variable divider for dividing a signal output from the voltage-controlled oscillator;
    a mash modulator, coupled to the variable divider, for pseudo-randomly altering a divide-by ratio of the variable divider; and
    a phase detector, coupled to the variable divider and the first and second tuning circuits, for comparing a phase of a reference signal to a phase of the signal output from the voltage-controlled oscillator.

18. The integrated circuit of claim 17, wherein the variable divider, the mash modulator and the phase detector are formed on the at least one semiconductor substrate.

* * * * *